(12) United States Patent
Morimoto et al.

(10) Patent No.: US 8,401,044 B2
(45) Date of Patent: Mar. 19, 2013

(54) SEMICONDUCTOR LIGHT EMITTING ELEMENT, DRIVING METHOD OF SEMICONDUCTOR LIGHT EMITTING ELEMENT, LIGHT EMITTING DEVICE, AND OPTICAL PULSE TESTER USING LIGHT EMITTING DEVICE

(75) Inventors: Shintaro Morimoto, Atsugi (JP);
Hiroshi Mori, Atsugi (JP); Yasuaki Nagashima, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 62 days.

(21) Appl. No.: 13/151,597

(22) Filed: Jun. 2, 2011

(65) Prior Publication Data
US 2012/0044481 A1 Feb. 23, 2012

(30) Foreign Application Priority Data
Aug. 17, 2010 (JP) .................. 2010-182234

(51) Int. Cl.
*H01S 3/10* (2006.01)
*H01S 3/13* (2006.01)
(52) U.S. Cl. ..................... 372/23; 372/29.02
(58) Field of Classification Search .......... 372/23, 372/29.02
See application file for complete search history.

(56) References Cited

U.S. PATENT DOCUMENTS 5,708,674 A * 1/1998 Beernink et al. ........... 372/50.12
5,717,707 A * 2/1998 Beernink et al. ......... 372/46.016

FOREIGN PATENT DOCUMENTS

JP  2008-209266 A  9/2008
JP  2010-192601 A  9/2010

* cited by examiner

*Primary Examiner* — Tod T Van Roy
*Assistant Examiner* — Marcia Golub-Miller
(74) *Attorney, Agent, or Firm* — Greer, Burns & Crain, Ltd.

(57) ABSTRACT

[Task] To provide a semiconductor light emitting element capable of emitting light beams with wavelengths in a plurality of wavelength ranges with a high optical output, a driving method of a semiconductor light emitting element capable of making a semiconductor light emitting element that can emit light beams with wavelengths in a plurality of wavelength ranges operate with a high optical output, a light emitting device, and a small and high-performance optical pulse tester using the light emitting device.

[Means for Resolution] In a driving method of a semiconductor light emitting element with a configuration in which an active layer 13a with a gain wavelength $\lambda_1$ of about 1.55 μm and an active layer 13b with a gain wavelength $\lambda_2$ of about 1.3 μm are optically coupled along the guiding direction of light and are disposed in series in order of the length of the gain wavelengths $\lambda_1$ and $\lambda_2$ and a diffraction grating 20 with a Bragg wavelength of the short gain wavelength $\lambda_2$ is formed near the active layer 13b with the short gain wavelength $\lambda_2$ and near a butt-joint coupling portion 19 between the active layers 13a and 13b, an upper electrode provided above the active layer 13b is short-circuited to a lower electrode provided on a bottom surface of a semiconductor substrate so that a leakage current does not flow into the active layer 13b when a driving current is applied to the active layer 13a.

13 Claims, 6 Drawing Sheets

SEMICONDUCTOR LIGHT EMITTING ELEMENT, DRIVING METHOD OF SEMICONDUCTOR LIGHT EMITTING ELEMENT, LIGHT EMITTING DEVICE, AND OPTICAL PULSE TESTER USING LIGHT EMITTING DEVICE

TECHNICAL FIELD

The present invention relates to a semiconductor light emitting element, a driving method of a semiconductor light emitting element, a light emitting device, and an optical pulse tester using a light emitting device.

BACKGROUND ART

In the field of optical communication, a system which outputs light beams with a plurality of wavelengths is used. For example, in the case of a system of outputting laser beams with two wavelengths, a configuration is adopted in which two semiconductor lasers manufactured for respective wavelengths are prepared and output light beams from the semiconductor lasers are mixed to be output (for example, refer to Patent Document 1).

In contrast, the inventor of this application proposes, as a two-wavelength laser light source configured without requiring such a complicated optical system, a semiconductor light emitting element capable of emitting laser beams with a plurality of wavelengths from a single chip by connecting a plurality of active layers with very different gain wavelengths in series and disposing a diffraction grating inside to realize independent oscillation of each wavelength (refer to Patent Document 2).

Related Art Documents

[Patent Documents]
[Patent Document 1] Japanese Unexamined Patent Application Publication No. 2008-209266
[Patent Document 2] Japanese Patent Application No. 2009-34080 (Japanese Unexamined Patent Application Publication No. 2010-192601)

DISCLOSURE OF THE INVENTION

[Problem that the Invention is to Solve]

However, in the configuration disclosed in Patent Document 2, when applying a driving current to an active layer for a long wavelength for oscillation, a leakage carrier flows into an adjacent active layer for a short wavelength. Since this causes free carrier absorption, there has been a problem in that output is reduced.

The present invention has been made to solve such a problem, and it is an object of the present invention to suppress an optical output reduction caused by absorption of light, which is emitted and amplified by an active layer for a long wavelength, by carriers leaking from the active layer for a long wavelength when the light passes through an active layer for a short wavelength in a semiconductor light emitting element in which active layers with a plurality of different gain wavelengths are connected in series.

[Means for Solving the Problem]

According to an aspect of the present invention, a semiconductor light emitting element includes: first and second light emitting end facets formed by cleavage respectively, wherein a plurality of active layers having gain wavelengths in different wavelength ranges are disposed on a semiconductor substrate so as to be optically coupled in a guiding direction of light from the first light emitting end facet toward the second light emitting end facet in order of the length of the gain wavelength; a lower electrode formed on a bottom surface of the semiconductor substrate; a plurality of upper electrodes formed above the plurality of active layers; and at least one diffraction grating which is formed near an active layer with a short gain wavelength between two adjacent active layers and near the interface between the two active layers and which has a Bragg wavelength equivalent to the short gain wavelength. The upper electrode provided above the active layer with a short gain wavelength is short-circuited to the lower electrode so that when a driving current is applied to one of the plurality of active layers, a leakage current does not flow into an active layer with a shorter gain wavelength adjacent to the active layer to which the driving current is applied. Light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet.

Through this configuration, it is possible to realize a semiconductor light emitting element capable of preventing an oscillation output reduction occurring when a part of a driving current applied to an active layer for a long wavelength leaks into an adjacent active layer for a short wavelength and absorbs light emitted from the active layer for a long wavelength.

Moreover, in the semiconductor light emitting element according to the aspect of the present invention, a reflectance with respect to light emitted from the second light emitting end facet may be set to be lower than a reflectance with respect to light emitted from the first light emitting end facet.

Moreover, in the semiconductor light emitting element according to the aspect of the present invention, the plurality of active layers may include first and second active layers, the gain wavelength of the first active layer may be 1.52 to 1.58 µm, and the gain wavelength of the second active layer may be 1.28 to 1.34 µm. Through this configuration, light with a wavelength of about 1.3 µm and light with a wavelength of about 1.55 µm can be made to oscillate in a plurality of longitudinal modes using one element.

Moreover, in the semiconductor light emitting element according to the aspect of the present invention, the plurality of active layers may include first to third active layers, the gain wavelength of the first active layer may be 1.60 to 1.65 µm, the gain wavelength of the second active layer may be 1.52 to 1.58 µm, and the gain wavelength of the third active layer may be 1.28 to 1.34 µm. Through this configuration, light with a wavelength of about 1.3 µm, light with a wavelength of about 1.55 µm, and light with a wavelength of about 1.625 µm can be made to oscillate in a plurality of longitudinal modes using one element.

According to another aspect of the present invention, a driving method of a semiconductor light emitting element includes: short-circuiting an upper electrode provided above an active layer with a short gain wavelength to a lower electrode provided on a bottom surface of a semiconductor substrate so that when a driving current is applied to one of a plurality of active layers, a leakage current does not flow into an active layer with a shorter gain wavelength adjacent to the active layer to which the driving current is applied. The semiconductor light emitting element has first and second light emitting end facets formed by cleavage, respectively, wherein a plurality of active layers having gain wavelengths in different wavelength ranges are disposed on the semiconductor substrate so as to be optically coupled in a guiding direction of light from the first light emitting end facet toward the second light emitting end facet in order of the length of the gain wavelength, a lower electrode is formed on the bottom surface of the semiconductor substrate and a plurality of upper electrodes for applying a driving current to each of the plurality of active layers are formed above the plurality of active layers, at least one diffraction grating with a Bragg wavelength equivalent to a short gain wavelength is formed near an active layer with the short gain wavelength between two adjacent active layers and near the interface between the two active layers, and light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet.

Through this driving method, it is possible to prevent an oscillation output reduction occurring when a part of a driving current applied to an active layer for a long wavelength leaks into an adjacent active layer for a short wavelength and absorbs light emitted from the active layer for a long wavelength.

Moreover, in the driving method of the semiconductor light emitting element according to the aspect of the present invention, a reflectance with respect to light emitted from the second light emitting end facet of the semiconductor light emitting element may be set to be lower than a reflectance with respect to light emitted from the first light emitting end facet of the semiconductor light emitting element.

Moreover, in the driving method of the semiconductor light emitting element according to the aspect of the present invention, the plurality of active layers may include first and second active layers, the gain wavelength of the first active layer may be 1.52 to 1.58 μm, and the gain wavelength of the second active layer may be 1.28 to 1.34 μm. Through this configuration, light with a wavelength of about 1.3 μm and light with a wavelength of about 1.55 μm can be made to oscillate in a plurality of longitudinal modes using one element.

Moreover, in the driving method of the semiconductor light emitting element according to the aspect of the present invention, the plurality of active layers may include first to third active layers, the gain wavelength of the first active layer may be 1.60 to 1.65 μm, the gain wavelength of the second active layer may be 1.52 to 1.58 μm, and the gain wavelength of the third active layer may be 1.28 to 1.34 μm. Through this configuration, light with a wavelength of about 1.3 μm, light with a wavelength of about 1.55 μm, and light with a wavelength of about 1.625 μm can be made to oscillate in a plurality of longitudinal modes using one element.

According to still another aspect of the present invention, a light emitting device includes: a semiconductor light emitting element having first and second light emitting end facets formed by cleavage, respectively, wherein a plurality of active layers having gain wavelengths in different wavelength ranges are disposed on a semiconductor substrate so as to be optically coupled in a guiding direction of light from the first light emitting end facet toward the second light emitting end facet in order of the length of the gain wavelength, a lower electrode is formed on a bottom surface of the semiconductor substrate and a plurality of upper electrodes for applying a driving current to each of the plurality of active layers is formed above the plurality of active layers, at least one diffraction grating with a Bragg wavelength equivalent to a short gain wavelength is formed near an active layer with the short gain wavelength between two adjacent active layers and near the interface between the two active layers, and light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet; and a light emitting element driving circuit which applies a driving current to each of the plurality of active layers and which short-circuits the upper electrode provided above an active layer with a short gain wavelength to the lower electrode provided on the bottom surface of the semiconductor substrate so that when a driving current is applied to one of the plurality of active layers, a leakage current does not flow into an active layer with a shorter gain wavelength adjacent to the active layer to which the driving current is applied.

Through this configuration, it is possible to realize a light emitting device capable of preventing an oscillation output reduction occurring when a part of a driving current applied to an active layer for a long wavelength leaks into an adjacent active layer for a short wavelength and absorbs light emitted from the active layer for a long wavelength.

Moreover, in the light emitting device according to the aspect of the present invention, a reflectance with respect to light emitted from the second light emitting end facet is set to be lower than a reflectance with respect to light emitted from the first light emitting end facet.

Moreover, in the light emitting device according to the aspect of the present invention, the plurality of active layers may include first and second active layers, the gain wavelength of the first active layer may be 1.52 to 1.58 μm, and the gain wavelength of the second active layer may be 1.28 to 1.34 μm. Through this configuration, light with a wavelength of about 1.3 μm and light with a wavelength of about 1.55 μm can be made to oscillate in a plurality of longitudinal modes using one element.

Moreover, in the light emitting device according to the aspect of the present invention, the plurality of active layers may include first to third active layers, the gain wavelength of the first active layer may be 1.60 to 1.65 μm, the gain wavelength of the second active layer may be 1.52 to 1.58 μm, and the gain wavelength of the third active layer may be 1.28 to 1.34 μm. Through this configuration, light with a wavelength of about 1.3 μm, light with a wavelength of about 1.55 μm, and light with a wavelength of about 1.625 μm can be made to oscillate in a plurality of longitudinal modes using one element.

According to still another aspect of the present invention, an optical pulse tester includes: the light emitting device according to the aspect of the present invention in which the driving current applied by the light emitting element driving circuit has a pulse form so that the semiconductor light emitting element emits an optical pulse and which outputs the optical pulse emitted from the second light emitting end facet of the semiconductor light emitting element to an optical fiber to be measured; a light receiving section which converts returned light of the optical pulse from the optical fiber to be measured into an electric signal; and a signal processor which analyzes a loss distribution characteristic of the optical fiber to be measured on the basis of the electric signal converted by the light receiving section.

Through this configuration, since a semiconductor light emitting element capable of making light beams with wavelengths in a plurality of wavelength ranges oscillate in a plurality of longitudinal modes can operate with a high optical output, a small and high-performance optical pulse tester can be realized.

[Advantage of the Invention]

The present invention provides a semiconductor light emitting element capable of emitting light beams with wavelengths in a plurality of wavelength ranges with a high optical output, a driving method of a semiconductor light emitting element capable of making a semiconductor light emitting element that can emit light beams with wavelengths in a plurality of wavelength ranges operate with a high optical output, a light emitting device, and a small and high-performance optical pulse tester using the light emitting device.

BEST MODE FOR CARRYING OUT THE INVENTION

Hereinafter, embodiments of a semiconductor light emitting element, a driving method of a semiconductor light emitting element, a light emitting device, and an optical pulse tester using a light emitting device of the present invention will be described with reference to the accompanying drawings.

(First Embodiment)

Figure 1:
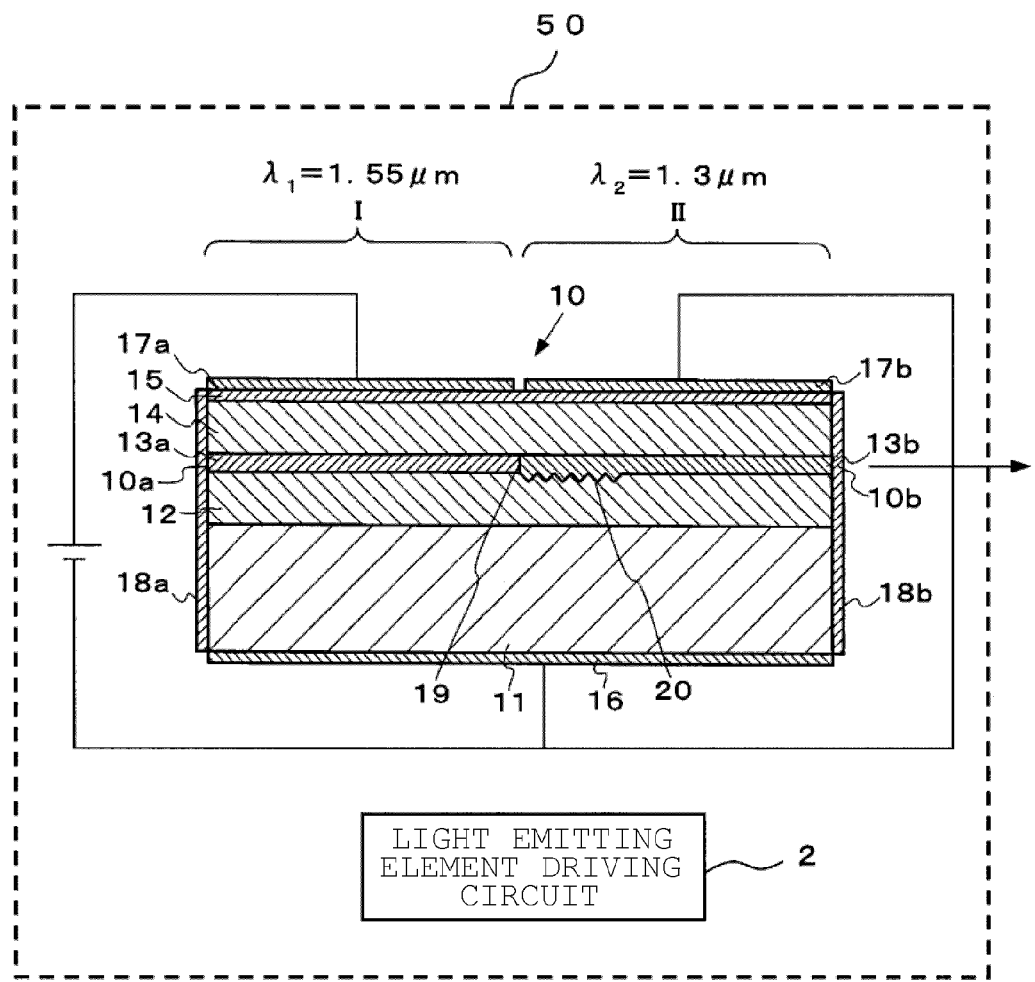
FIG. 1 is a view showing a light emitting device of a first embodiment of the present invention.
Figure 2:
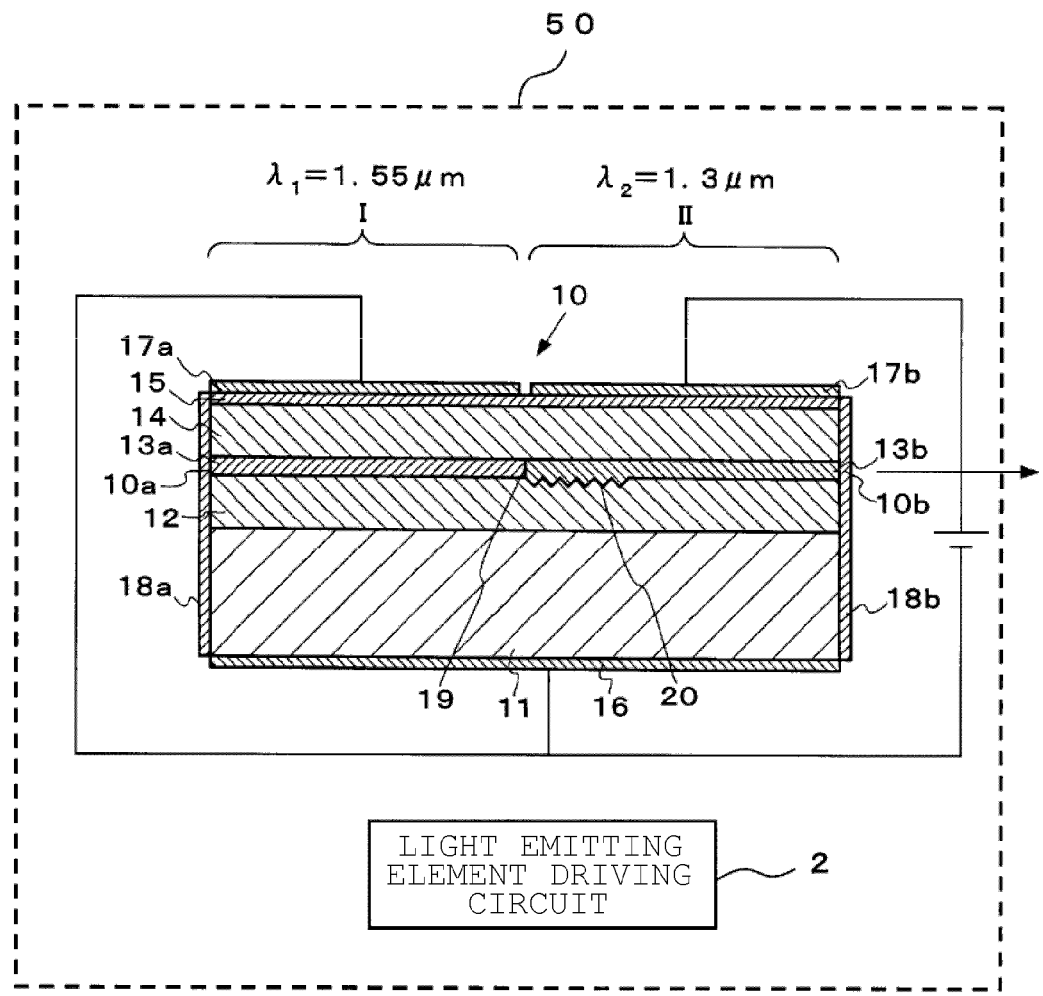
FIG. 2 is a view showing another aspect of the light emitting device of the first embodiment of the present invention.

A first embodiment of the light emitting device related to the present invention is shown in FIGS. 1 and 2. A light emitting device 50 is configured to include a semiconductor light emitting element 10 and a light emitting element driving circuit 2.

As shown in FIGS. 1 and 2, for example, the semiconductor light emitting element 10 includes: an n-type semiconductor substrate 11 formed of n-type InP (indium.phosphorus); an n-type InP cladding layer 12; a first gain region I having a first active layer 13a which is formed of InGaAsP (indium.gallium.arsenide.phosphorus) with a gain wavelength $\lambda_1$; and a second gain region II having a second active layer 13b which is formed of InGaAsP with a gain wavelength $\lambda_2$ ($<\lambda_1$).

Here, the gain wavelength is assumed to be a peak wavelength of a desired longitudinal mode among oscillation wavelengths of a plurality of longitudinal modes which will be described later. In the present embodiment, wavelengths 1.55 μm and 1.3 μm used in an optical pulse tester are used as examples of the gain wavelengths $\lambda_1$ and $\lambda_2$ for explanation. In addition, the gain wavelengths $\lambda_1$ and $\lambda_2$ may be values in the range of $1.52 \leq \lambda_1 \leq 1.58$ and $1.28 \leq \lambda_2 \leq 1.34$, respectively.

Alternatively, any combination from the respective wavelength ranges of 1.28 to 1.34, 1.47 to 1.50, 1.52 to 1.55, and 1.60 to 1.65 may be selected (in this case, they are selected such that $\lambda_1 > \lambda_2$ is satisfied. The unit is μm).

The first and second active layers 13a and 13b are disposed along the guiding direction of light and are optically coupled by the butt-joint method. In addition, the first and second active layers 13a and 13b referred to herein include a multiplex quantum well (MQW) structure and separate confinement heterostructure (SCH) layers with the MQW structure interposed therebetween.

In addition, a p-type InP cladding layer 14 and a contact layer 15, which is formed of p-type InGaAs (indium.gallium.arsenide), are laminated in this order on top surfaces of the first and second active layers 13a and 13b.

In addition, a lower electrode 16 is formed on the bottom surface of the n-type semiconductor substrate 11 by vapor deposition, and a first upper electrode 17a for a first gain region I and a second upper electrode 17b for a second gain region II are formed on the contact layer 15 by vapor deposition.

In addition, the semiconductor light emitting element 10 has first and second light emitting end facets 10a and 10b formed by cleavage, respectively. A high-reflection (HR) coat 18a is formed on the first light emitting end facet 10a and a low-reflection (LR) coat 18b is formed on the second light emitting end facet 10b, such that the reflectance with respect to light emitted from the second light emitting end facet 10b is lower than the reflectance with respect to light emitted from the first light emitting end facet 10a.

Here, it is preferable that the reflectance of the first light emitting end facet 10a formed with the HR coat 18a is set to 90% or more and the second light emitting end facet 10b formed with the LR coat 18b is set to about 1 to 10%.

Moreover, in the second gain region II of the n-type InP cladding layer 12, a diffraction grating 20 having a Bragg wavelength $\lambda_g$ of 1.3 μm and a coupling coefficient κ of 100 cm$^{-1}$ or more is formed near a butt-joint coupling portion 19 between the first and second active layers 13a and 13b.

In addition, the diffraction grating 20 may be formed in a lower portion of the second active layer 13b as shown in FIG. 1, or may be formed within the p-type InP cladding layer 14 above the second active layer 13b (not shown). In addition, the diffraction grating may also be formed near the first light emitting end facet 10a of the first gain region I.

A method of manufacturing the semiconductor light emitting element with such a structure is disclosed in detail in Patent Document 2.

The light emitting element driving circuit 2 has a function of applying a driving current between a corresponding upper electrode and a lower electrode in order to make light with a desired wavelength oscillate and also has a function of short-circuiting other upper electrodes to the lower electrode (described in detail later).

Next, a driving method of the semiconductor light emitting element 10 in the light emitting device 50 of the present embodiment configured as described above will be described.

First, the operation will be described. When a driving current is applied between the first upper electrode 17a for the first gain region I and the lower electrode 16, the inside of the first active layer 13a has a light emitting state. Light with a wavelength of about 1.55 μm generated in the first active layer 13a is not absorbed in the second active layer 13b which has a gain wavelength of 1.3 μm and is not reflected by the diffraction grating 20 which has the Bragg wavelength $\lambda_g$ of 1.3 μm, and propagates through the first and second active layers 13a and 13b. The light with a wavelength of about 1.55 μm generated in the first active layer 13a oscillates in a plurality of longitudinal modes of about 1.55 μm and is emitted from the second light emitting end facet 10b which is formed with the LR coat 18b, in the resonator formed by the first and second light emitting end facets 10a and 10b.

As described above, when a driving current is applied between the first upper electrode 17a for the first gain region I and the lower electrode 16, the inside of the first active layer 13a has a light emitting state. However, since the isolation resistance between the first and second upper electrodes 17a and 17b is limited, a portion of the current leaks into the second active layer 13b.

Therefore, in the driving method of the present invention, when emitting light in the first gain region I, the second upper electrode 17b and the lower electrode 16 are made to be short-circuited as shown in FIG. 1. As a result, since optical absorption caused by carriers when a leakage current from the first gain region I flows through the second gain region II is suppressed, the laser beam output efficiency based on light emission of the first gain region I is improved.

Figure 6:
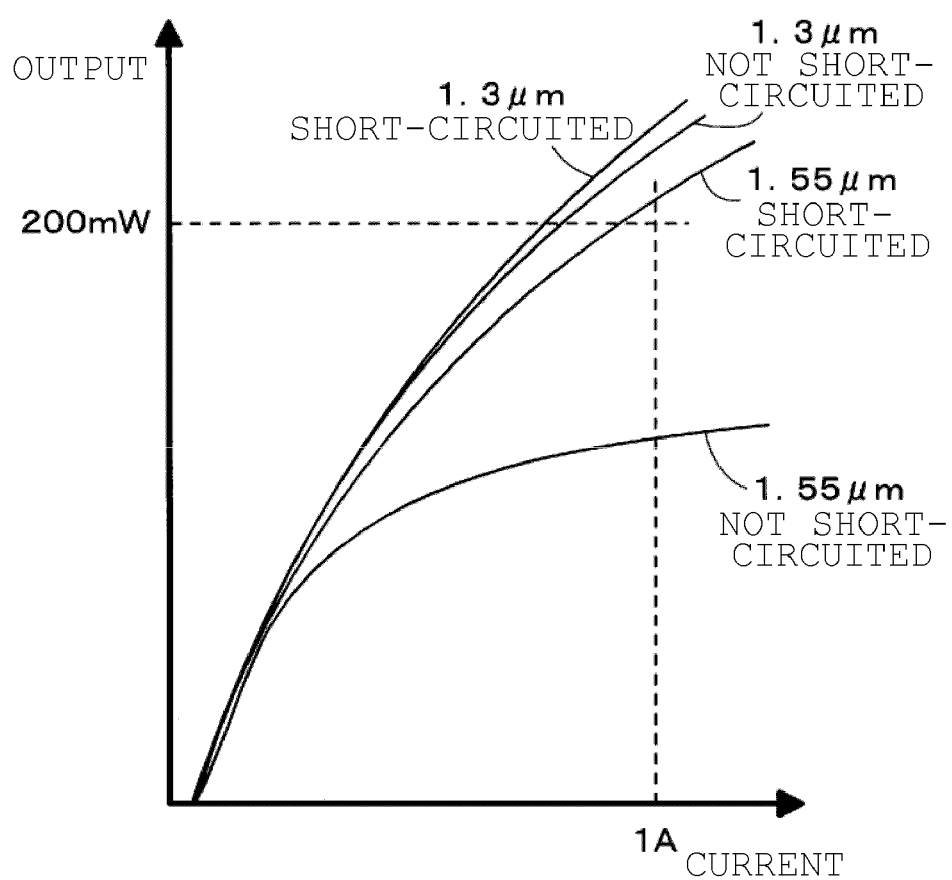
FIG. 6 is a view showing the characteristics of a semiconductor light emitting element of the light emitting device of the first embodiment of the present invention.

As shown in FIG. 6, this greatly improves the saturation conditions of 1.55 µm light output especially at the time of a high current. Accordingly, a high-output operation is realized. Since an output of 200 mW or more from the second light emitting end facet is obtained, high performance of 35 dB or more is obtained as a dynamic range when this is used for an optical time domain reflectometer which is a representative example of the optical pulse tester.

On the other hand, when a driving current is applied between the second upper electrode 17b for the second gain region II and the lower electrode 16 as shown in FIG. 2, the inside of the second active layer 13b has a light emitting state.

Light with a wavelength of about 1.3 µm generated in the second active layer 13b propagates through the second active layer 13b. Since 90% or more of this 1.3 µm light is reflected by the diffraction grating 20 which has a Bragg wavelength $\lambda_g$ of 1.3 µm, optical absorption in the first active layer 13a with a gain wavelength of 1.55 µm is suppressed. Therefore, the light with a wavelength of about 1.3 µm generated in the second active layer 13b oscillates in a plurality of longitudinal modes of about 1.3 µm and is emitted from the second light emitting end facet 10b formed with the LR coat 18b in the resonator formed by the diffraction grating 20 and the second light emitting end facet 10b.

In this case, most of the light with a wavelength of about 1.3 µm generated in the second active layer 13b is hardly incident on the first active layer 13a. Accordingly, the effect obtained by short-circuiting the first upper electrode 17a as shown in FIG. 6 becomes smaller than that in the above case.

As described above, in the driving method of the semiconductor light emitting element in the light emitting device of the present embodiment, the saturation of an optical output is suppressed by short-circuiting the other upper electrode to the lower electrode when applying a driving current between one upper electrode and the lower electrode. As a result, a high optical output can be realized. In particular, by short-circuiting an upper electrode for a short wavelength when making light with a long wavelength oscillate, a large effect can be acquired.

(Second Embodiment)

A second embodiment of the light emitting device related to the present invention will be described with reference to the accompanying drawings. The same configuration as in the first embodiment will not be described. In the present embodiment, wavelengths 1.625 µm, 1.55 µm, and 1.3 µm used in an optical pulse tester are used as examples of the gain wavelengths $\lambda_1$, $\lambda_2$, and $\lambda_3$ for explanation. In addition, the gain wavelengths $\lambda_1$, $\lambda_2$, and $\lambda_3$ may be values in the range of $1.60 \leq \lambda_1 \leq 1.65$, $1.52 \leq \lambda_2 < 1.58$, and $1.28 \leq \lambda_3 \leq 1.34$, respectively.

Alternatively, any combination from the respective wavelength ranges of 1.28 to 1.34, 1.47 to 1.50, 1.52 to 1.55, and 1.60 to 1.65 may be selected (in this case, they are selected such that $\lambda_1 > \lambda_2 > \lambda_3$ is satisfied. The unit is µm).

Figure 3:
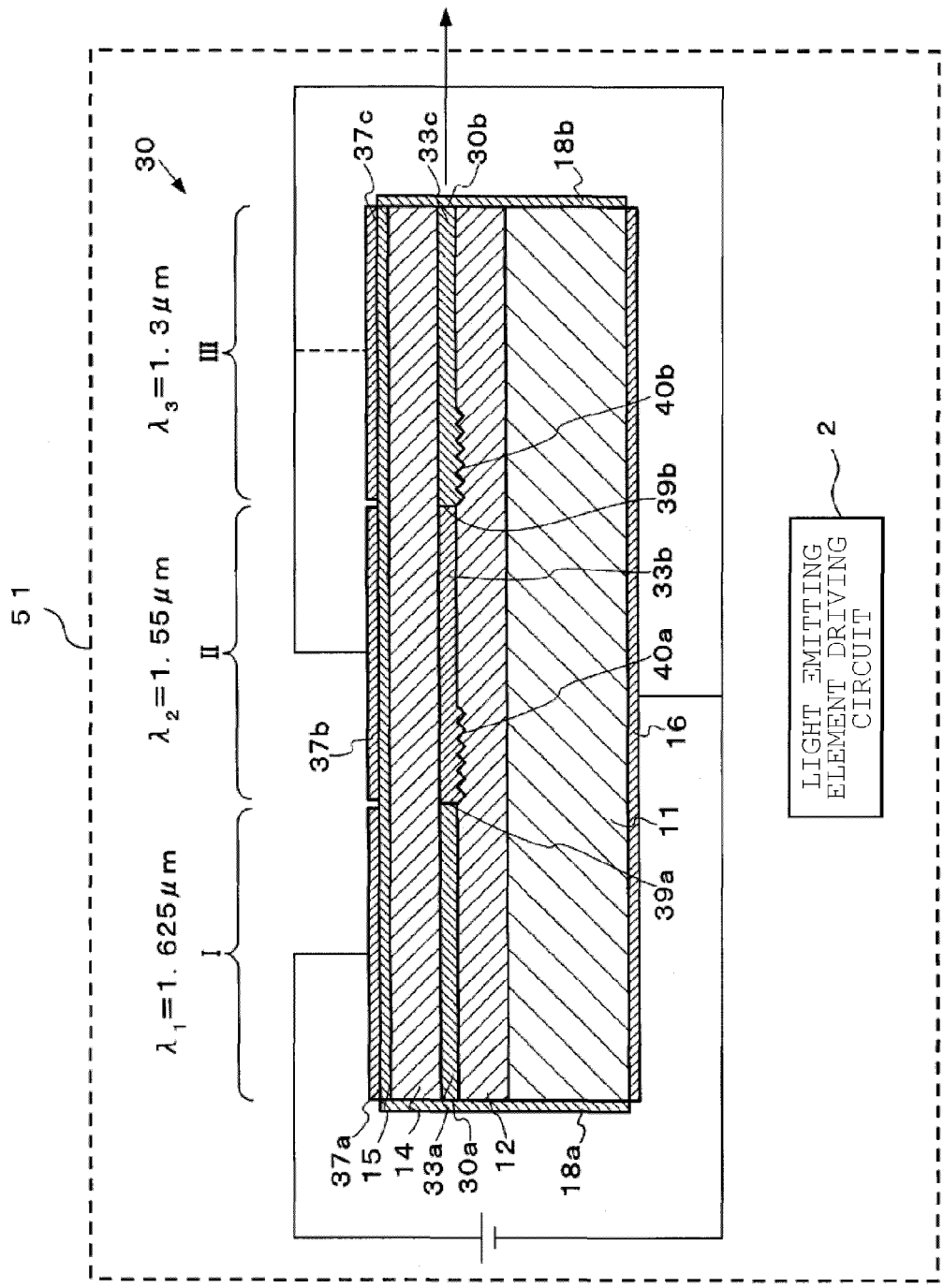
FIG. 3 is a view showing a light emitting device of a second embodiment of the present invention.
Figure 4:
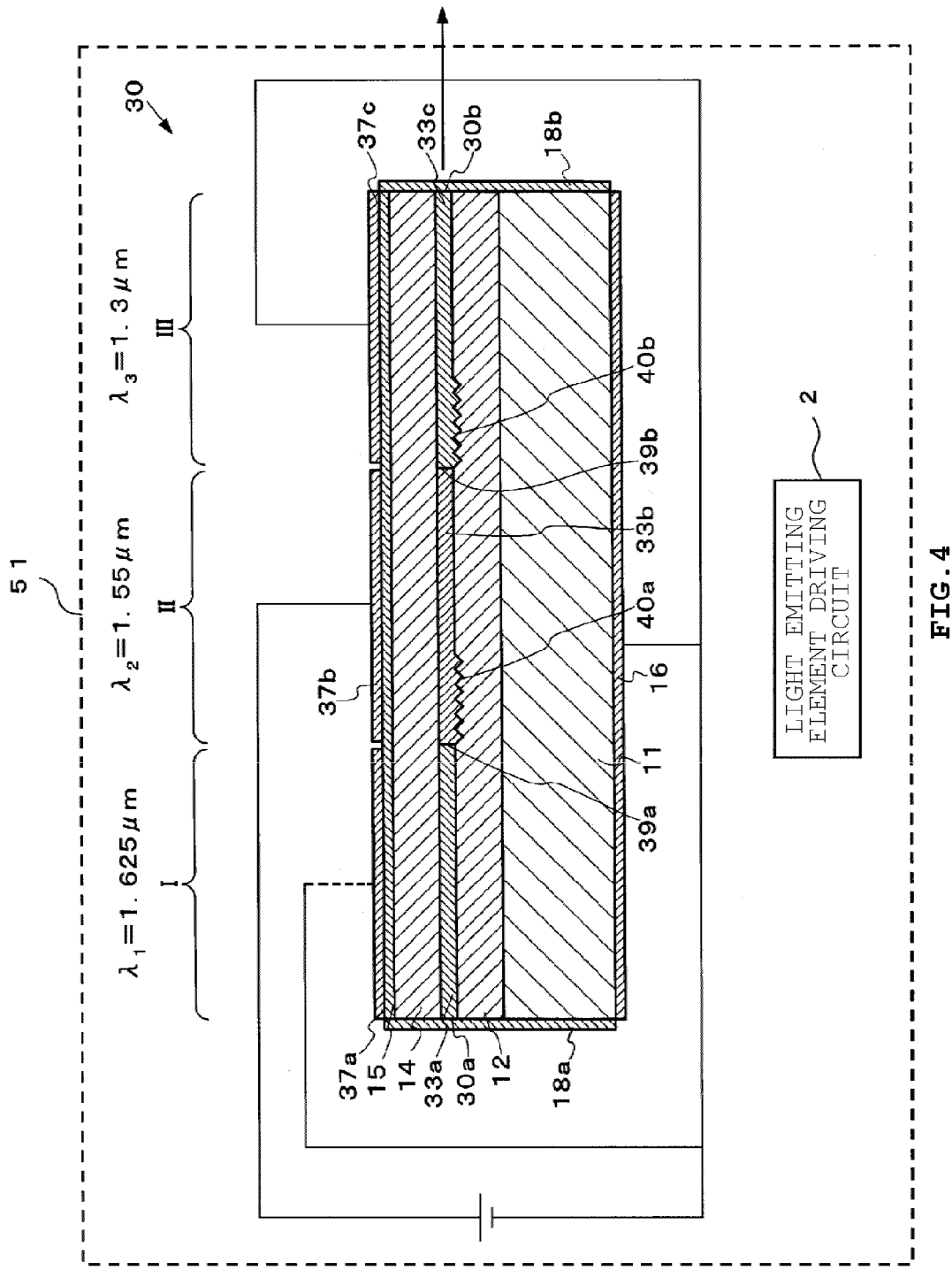
FIG. 4 is a view showing another aspect of the light emitting device of the second embodiment of the present invention.

FIGS. 3 and 4 are views showing the second embodiment of the light emitting device related to the present invention. A light emitting device 51 is configured to include a semiconductor light emitting element 30 and a light emitting element driving circuit 2.

As shown in FIGS. 3 and 4, the semiconductor light emitting element 30 includes a first gain region I having a first active layer 33a which is formed of InGaAsP with a gain wavelength $\lambda_1$ of 1.625 µm, a second gain region II having a second active layer 33b which is formed of InGaAsP with a gain wavelength $\lambda_2$ of 1.55 µm, and a third gain region III having a third active layer 33c which is formed of InGaAsP with a gain wavelength $\lambda_3$ of 1.3 µm.

The first, second, and third active layers 33a, 33b, and 33c are disposed in this order along the guiding direction of light and are optically coupled by the butt-joint method. In addition, the first, second, and third active layers 33a, 33b, and 33c referred to herein include an MQW structure and SCH layers with the MQW structure interposed therebetween.

In addition, a lower electrode 16 is formed on the bottom surface of the n-type semiconductor substrate 11 by vapor deposition, and a first upper electrode 37a for a first gain region I, a second upper electrode 37b for a second gain region II, and a third upper electrode 37c for a third gain region III are formed on the contact layer 15 by vapor deposition.

In addition, the semiconductor light emitting element 30 has first and second light emitting end facets 30a and 30b formed by cleavage, respectively. Similar to the first embodiment, an HR coat 18a is formed on the first light emitting end facet 30a, and an LR coat 18b is formed on the second light emitting end facet 30b.

Moreover, in the second gain region II of the n-type InP cladding layer 12, a diffraction grating 40a having a Bragg wavelength $\lambda_{ga}$ of 1.55 µm and a coupling coefficient κ of 100 cm$^{-1}$ or more is formed near a butt-joint coupling portion 39a between the first and second active layers 33a and 33b. Here, the pitch of the diffraction grating 40a is about 0.24 µm.

Similarly, in the third gain region III of the n-type InP cladding layer 12, a diffraction grating 40b having a Bragg wavelength $\lambda_{gb}$ of 1.3 µm and a coupling coefficient κ of 100 cm$^{-1}$ or more is formed near a butt-joint coupling portion 39b between the second and third active layers 33b and 33c.

In addition, the diffraction gratings 40a and 40b may be formed in lower portions of the second and third active layers 33b and 33c as described above and as shown in FIG. 2, or may be formed within the p-type InP cladding layer 14 above the second active layer 33b and (or) the third active layer 33c (not shown). In addition, the diffraction grating may also be formed near the first light emitting end facet 30a of the first gain region I.

Next, a driving method of the semiconductor light emitting element 30 in the light emitting device 51 of the present embodiment configured as described above will be described.

First, the operation will be described. As shown in FIG. 3, when a driving current is applied between the first upper electrode 37a for the first gain region I and the lower electrode 16, the inside of the first active layer 33a has a light emitting state. Light with a wavelength of about 1.625 µm generated in the first active layer 33a is not absorbed in the second active layer 33b which has a gain wavelength of 1.55 µm and the third active layer 33c which has a gain wavelength of 1.3 µm and is not reflected by the diffraction grating 40a with the Bragg wavelength $\lambda_{ga}$ of 1.55 μm and the diffraction grating 40b with the Bragg wavelength $\lambda_{gb}$ of 1.3 μm, and propagates through the first, second, and third active layers 33a, 33b, and 33c. The light with a wavelength of about 1.625 μm generated in the first active layer 33a oscillates in a plurality of longitudinal modes of about 1.625 μm and is emitted from the second light emitting end facet 30b formed with the LR coat 18b, in the resonator formed by the first and second light emitting end facets 30a and 30b.

As described above, when a driving current is applied between the first upper electrode 37a for the first gain region I and the lower electrode 16, the inside of the first active layer 33a has a light emitting state. However, since the isolation resistance between the first and second upper electrodes 37a and 37b is limited, a portion of the current leaks into the second active layer 33b.

Therefore, in the driving method of the present invention, when emitting light in the first gain region I, the second upper electrode 37b and the lower electrode 16 are made to be short-circuited. As a result, since optical absorption caused by carriers when a leakage current from the first gain region I flows through the second gain region II is suppressed, the laser beam output efficiency based on light emission of the first gain region I is improved. Although the third upper electrode 37c may also be short-circuited to the lower electrode 16 in addition to short-circuiting the second upper electrode 37b to the lower electrode 16, it is clear that it is important to short-circuit the second upper electrode 37b adjacent to the first gain region I in order to achieve the effect.

This significantly suppresses the saturation of 1.625 μm light output especially at the time of a high current. Accordingly, a high-output operation is realized.

On the other hand, when a driving current is applied between the second upper electrode 37b for the second gain region II and the lower electrode 16 as shown in FIG. 4, the inside of the second active layer 33b has a light emitting state. Since 90% or more of light with a wavelength of about 1.55 μm generated in the second active layer 33b is reflected by the diffraction grating 40a which has a Bragg wavelength $\lambda_{ga}$ of 1.55 μm, optical absorption in the first active layer 33a with a gain wavelength of 1.625 μm can be suppressed. In addition, light with a wavelength of about 1.55 μm generated in the second active layer 33b is not absorbed in the third active layer 33c with a gain wavelength of 1.3 μm and is not reflected by the diffraction grating 40b with the Bragg wavelength $\lambda_{gb}$ of 1.3 μm, and propagates through the second and third active layers 33b and 33c. The light with a wavelength of about 1.55 μm generated in the second active layer 33b oscillates in a plurality of longitudinal modes of about 1.55 μm and is emitted from the second light emitting end facet 30b formed with the LR coat 18b in the resonator formed by the diffraction grating 40a and the second light emitting end facet 30b.

Also in this case, the third upper electrode 37c is short-circuited to the lower electrode 16, as described in the first embodiment, in order to suppress a leakage current to the third active layer 33c, through which light moves back and forth, as a part of the resonator. This greatly improves about 1.55 μm light wavelength light output especially at the time of a high current. Although the first upper electrode 37a may also be short-circuited to the lower electrode 16 simultaneously, the effect is larger when short-circuiting the third upper electrode.

On the other hand, when a current is applied between the third upper electrode 37c for the third gain regions III and the lower electrode 16, the inside of the third active layer 33c has a light emitting state (not shown).

Since 90% or more of light with a wavelength of 1.3 μm generated in the third active layer 33c is reflected by the diffraction grating 40b which has a Bragg wavelength $\lambda_{gb}$ of 1.3 μm, optical absorption in the first active layer 33a with a gain wavelength of 1.625 μm and the second active layer 33b with a gain wavelength of 1.55 μm can be suppressed. The light with a wavelength of about 1.3 μm generated in the third active layer 33c oscillates in a plurality of longitudinal modes of about 1.3 μm and is emitted from the second light emitting end facet 30b formed with the LR coat 18b in the resonator formed by the diffraction grating 40b and the second light emitting end facet 30b. Therefore, the optical output is improved by short-circuiting the first upper electrode 37a and the second upper electrode 37b as described in the first embodiment, but the effect is small. Moreover, in this case, it is needless to say that short-circuiting the second upper electrode 37b adjacent to the third gain region III is important.

As described above, in the driving method of the semiconductor light emitting element in the light emitting device of the present embodiment, the saturation of an optical output is suppressed by short-circuiting other upper electrodes to the lower electrode when applying a driving current between one upper electrode and the lower electrode. As a result, a high optical output can be realized. In particular, by short-circuiting an adjacent upper electrode for a short wavelength when making light with a long wavelength oscillate, a large effect can be acquired.

(Third Embodiment)

The light emitting devices 50 and 51 of the first and second embodiments capable of making light beams with wavelengths in a plurality of different wavelength ranges oscillate in a plurality of longitudinal modes can be used as light sources of the optical pulse tester. Hereinafter, an embodiment of the optical pulse tester using the light emitting devices 50 and 51 will be described with reference to the accompanying drawings.

Figure 5:
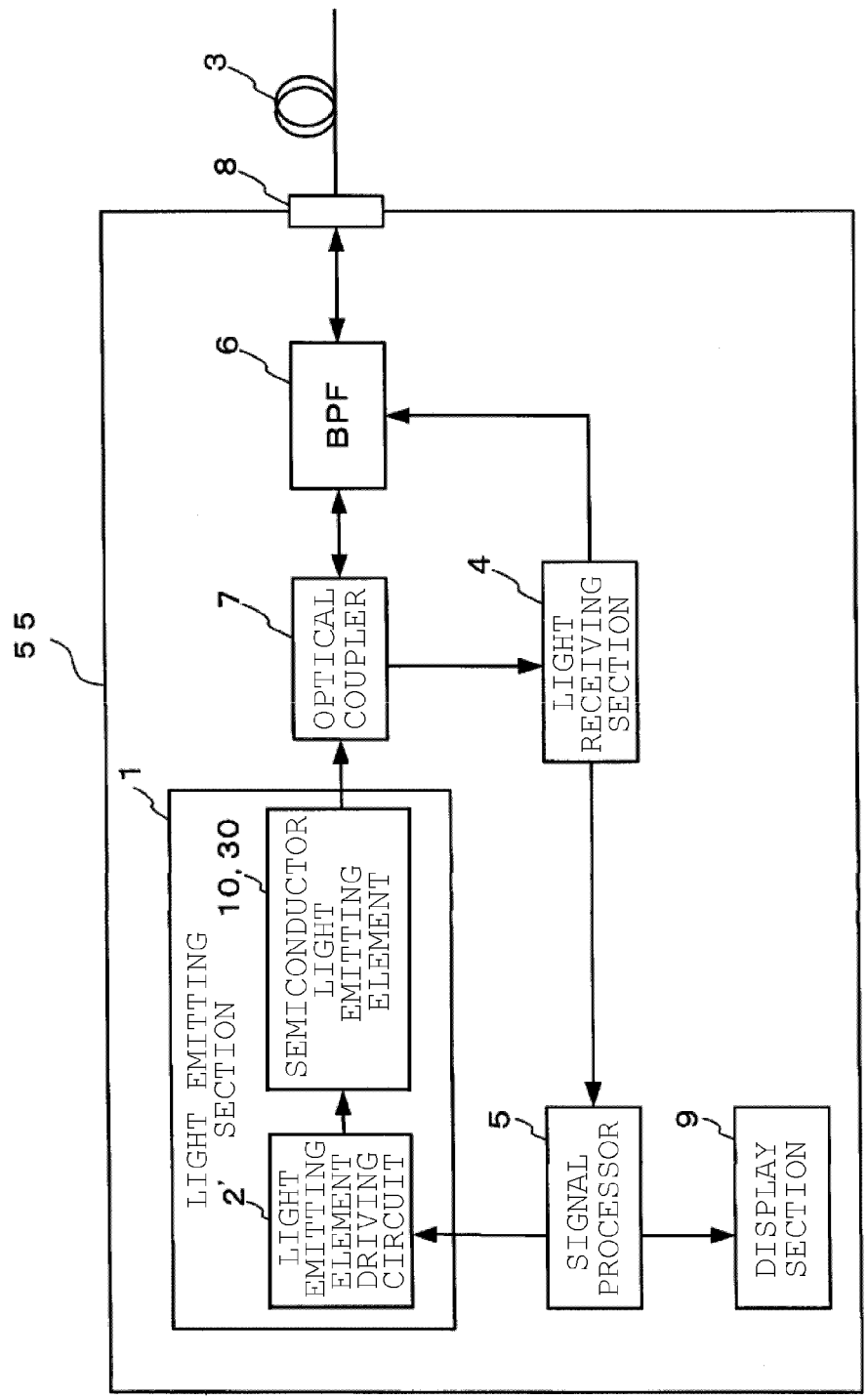
FIG. 5 is a block diagram showing the configuration of an optical pulse tester of a third embodiment of the present invention.

As shown in FIG. 5, an optical pulse tester 55 of a third embodiment includes: a light emitting section 1 that has the semiconductor light emitting elements 10 and 30 and a light emitting element driving circuit 2', which applies a pulsed driving current for emitting a optical pulse to the semiconductor light emitting elements 10 and 30, and that is a light emitting device which outputs to an optical fiber to be measured 3 the optical pulse emitted from the second light emitting end facets 10b and 30b of the semiconductor light emitting elements 10 and 30; a light receiving section 4 that converts returned light of the optical pulse from the optical fiber to be measured 3 into an electric signal; and a signal processor 5 which analyzes the loss distribution characteristic of the optical fiber to be measured 3 on the basis of the electric signal converted by the light receiving section 4.

The light emitting element driving circuit 2' in the third embodiment applies a pulsed driving current unlike the light emitting element driving circuit 2 in the first and second embodiments.

In addition, the signal processor 5 controls a timing at which the light emitting element driving circuit 2' applies a driving current to the semiconductor light emitting elements 10 and 30.

In addition, the optical pulse tester 55 of the present embodiment includes an optical coupler 7, which outputs the optical pulse from the light emitting section 1 to a band pass filter (BPF) 6 and also outputs the returned light from the optical fiber to be measured 3 to the light receiving section 4, an optical connector 8 for optical coupling to the optical fiber to be measured 3, and a display section 9 which displays a processing result of the signal processor 5.

Next, an operation of the optical pulse tester 55 of the present embodiment configured as described above will be described. In addition, in the following explanation, the optical pulse tester 55 of the present embodiment is assumed to include the semiconductor light emitting element 10.

First, a pulsed driving current is applied to the first gain region I (or the second gain region II) of the semiconductor light emitting element 10 by the light emitting element driving circuit 2', and the second upper electrode 17b (or the first upper electrode 17a) is short-circuited to the lower electrode 16. Then, an optical pulse of about 1.55 μm (or about 1.3 μm) is output from the light emitting section 1.

In this case, upper and lower electrodes are short-circuited in a gain region where light is not emitted.

In addition, the optical pulse output from the light emitting section 1 is incident on the optical fiber to be measured 3 through the optical coupler 7, the BPF 6, and the optical connector 8. The optical pulse incident on the optical fiber to be measured 3 becomes returned light and is received in the light receiving section 4 through the optical coupler 7.

The returned light is converted into an electric signal by the light receiving section 4 and is then input to the signal processor 5. Then, the loss distribution characteristic of the optical fiber to be measured 3 is calculated by the signal processor 5. The calculated loss distribution characteristic is displayed on the display section 9.

As described above, since the optical pulse tester 55 of the present embodiment includes the semiconductor light emitting element capable of making light beams with wavelengths in a plurality of different wavelength ranges oscillate with a high optical output using one element, miniaturization and high performance can be realized.

DESCRIPTION OF REFERENCE NUMERALS AND SIGNS

1: light emitting section (light emitting device)
2, 2': light emitting element driving circuit
3: optical fiber to be measured
4: light receiving section
5: signal processor
10, 30: semiconductor light emitting element
10a, 30a: first light emitting end facet
10b, 30b: second light emitting end facet
13a, 33a: first active layer
13b, 33b: second active layer
18a: high-reflection (HR) coat
18b: low-reflection (LR) coat
19, 39a, 39b: butt-joint coupling portion (interface)
20, 40a, 40b: diffraction grating
33c: third active layer
50, 51: light emitting device
55: optical pulse tester

The invention claimed is:

1. A semiconductor light emitting element comprising:
first and second light emitting end facets formed by cleavage respectively, wherein a plurality of active layers having gain wavelengths in different wavelength ranges are disposed on a semiconductor substrate so as to be optically coupled in a guiding direction of light from the first light emitting end facet toward the second light emitting end facet in order of the length of the gain wavelength;
a lower electrode formed on a bottom surface of the semiconductor substrate;
a plurality of upper electrodes formed above the plurality of active layers; and
at least one diffraction grating which is formed near an active layer with a short gain wavelength between two adjacent active layers and near the interface between the two active layers and which has a Bragg wavelength equivalent to the short gain wavelength,
wherein the upper electrode provided above the active layer with a short gain wavelength is short-circuited to the lower electrode so that when a driving current is applied to one of the plurality of active layers, a leakage current does not flow into an active layer with a shorter gain wavelength adjacent to the active layer to which the driving current is applied, and
light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet.

2. The semiconductor light emitting element according to claim 1,
wherein a reflectance with respect to light emitted from the second light emitting end facet is set to be lower than a reflectance with respect to light emitted from the first light emitting end facet.

3. The semiconductor light emitting element according to claim 1,
wherein the plurality of active layers includes first and second active layers,
the gain wavelength of the first active layer is 1.52 to 1.58 μm, and
the gain wavelength of the second active layer is 1.28 to 1.34 μm.

4. The semiconductor light emitting element according to claim 1,
wherein the plurality of active layers includes first to third active layers,
the gain wavelength of the first active layer is 1.60 to 1.65 μm,
the gain wavelength of the second active layer is 1.52 to 1.58 μm, and
the gain wavelength of the third active layer is 1.28 to 1.34 μm.

5. A driving method of a semiconductor light emitting element, comprising:
short-circuiting an upper electrode provided above an active layer with a short gain wavelength to a lower electrode provided on a bottom surface of a semiconductor substrate so that when a driving current is applied to one of a plurality of active layers, a leakage current does not flow into an active layer with a shorter gain wavelength adjacent to the active layer to which the driving current is applied,
the semiconductor light emitting element having first and second light emitting end facets formed by cleavage, respectively, wherein a plurality of active layers having gain wavelengths in different wavelength ranges are disposed on the semiconductor substrate so as to be optically coupled in a guiding direction of light from the first light emitting end facet toward the second light emitting end facet in order of the length of the gain wavelength, a lower electrode is formed on the bottom surface of the semiconductor substrate and a plurality of upper electrodes for applying a driving current to each of the plurality of active layers are formed above the plurality of active layers, at least one diffraction grating with a Bragg wavelength equivalent to a short gain wavelength is formed near an active layer with the short gain wavelength between two adjacent active layers and near the interface between the two active layers, and light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet.

6. The driving method of the semiconductor light emitting element according to claim 5,
wherein a reflectance with respect to light emitted from the second light emitting end facet of the semiconductor light emitting element is set to be lower than a reflectance with respect to light emitted from the first light emitting end facet of the semiconductor light emitting element.

7. The driving method of the semiconductor light emitting element according to claim 5,
wherein the plurality of active layers of the semiconductor light emitting element includes first and second active layers,
the gain wavelength of the first active layer is 1.52 to 1.58 µm, and
the gain wavelength of the second active layer is 1.28 to 1.34 µm.

8. The driving method of the semiconductor light emitting element according to claim 5,
wherein the plurality of active layers of the semiconductor light emitting element includes first to third active layers,
the gain wavelength of the first active layer is 1.60 to 1.65 µm,
the gain wavelength of the second active layer is 1.52 to 1.58 µm, and
the gain wavelength of the third active layer is 1.28 to 1.34 µm.

9. A light emitting device comprising:
a semiconductor light emitting element having first and second light emitting end facets formed by cleavage respectively, in which a plurality of active layers having gain wavelengths in different wavelength ranges are disposed on a semiconductor substrate so as to be optically coupled in a guiding direction of light from the first light emitting end facet toward the second light emitting end facet in order of the length of the gain wavelength, a lower electrode is formed on a bottom surface of the semiconductor substrate and a plurality of upper electrodes for applying a driving current to each of the plurality of active layers is formed above the plurality of active layers, at least one diffraction grating with a Bragg wavelength equivalent to a short gain wavelength is formed near an active layer with the short gain wavelength between two adjacent active layers and near the interface between the two active layers, and light generated in an active layer with a longest gain wavelength oscillates in a resonator formed by the first and second light emitting end facets and light generated in an active layer with a short gain wavelength oscillates in a resonator formed by the diffraction grating and the second light emitting end facet and both the light beams are emitted from the second light emitting end facet; and
a light emitting element driving circuit which applies a driving current to each of the plurality of active layers and which short-circuits the upper electrode provided above an active layer with a short gain wavelength to the lower electrode provided on the bottom surface of the semiconductor substrate so that when a driving current is applied to one of the plurality of active layers, a leakage current does not flow into an active layer with a shorter gain wavelength adjacent to the active layer to which the driving current is applied.

10. The light emitting device according to claim 9,
wherein a reflectance with respect to light emitted from the second light emitting end facet of the semiconductor light emitting element is set to be lower than a reflectance with respect to light emitted from the first light emitting end facet of the semiconductor light emitting element.

11. The light emitting device according to claim 9,
wherein the plurality of active layers of the semiconductor light emitting element includes first and second active layers,
the gain wavelength of the first active layer is 1.52 to 1.58 µm, and
the gain wavelength of the second active layer is 1.28 to 1.34 µm.

12. The light emitting device according to claim 9,
wherein the plurality of active layers of the semiconductor light emitting element includes first to third active layers,
the gain wavelength of the first active layer is 1.60 to 1.65 µm,
the gain wavelength of the second active layer is 1.52 to 1.58 µm, and
the gain wavelength of the third active layer is 1.28 to 1.34 µm.

13. An optical pulse tester comprising:
the light emitting device according to claim 9 in which the driving current applied by the light emitting element driving circuit has a pulse form so that the semiconductor light emitting element emits an optical pulse and which outputs the optical pulse emitted from the second light emitting end facet of the semiconductor light emitting element to an optical fiber to be measured;
a light receiving section which converts returned light of the optical pulse from the optical fiber to be measured into an electric signal; and
a signal processor which analyzes a loss distribution characteristic of the optical fiber to be measured on the basis of the electric signal converted by the light receiving section.

* * * * *